(12) United States Patent
Khlat

(10) Patent No.: US 9,614,476 B2
(45) Date of Patent: Apr. 4, 2017

(54) GROUP DELAY CALIBRATION OF RF ENVELOPE TRACKING

(71) Applicant: RF Micro Devices, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/789,464

(22) Filed: Jul. 1, 2015

(65) Prior Publication Data

US 2016/0006398 A1 Jan. 7, 2016

Related U.S. Application Data

(60) Provisional application No. 62/019,530, filed on Jul. 1, 2014.

(51) Int. Cl.
*H03G 3/20* (2006.01)
*H03F 3/04* (2006.01)
(Continued)

(52) U.S. Cl.
CPC ......... *H03F 1/0222* (2013.01); *H03F 1/0233* (2013.01); *H03F 3/245* (2013.01);
(Continued)

(58) Field of Classification Search
CPC .................................. H03G 3/20; H03F 3/04
(Continued)

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |

(Continued)

FOREIGN PATENT DOCUMENTS

| | | | |
|---|---|---|---|
| CN | 1076567 A | 9/1993 | |
| CN | 1211355 A | 3/1999 | |

(Continued)

OTHER PUBLICATIONS

Wang, Feipeng et al., An Improved Power-Added Efficiency 19-dBm Hybrid Envelope Elimination and Restoration Power Amplifier for 802.11g WLAN Applications, IEEE Transactions on Microwave Theory and Techniques, vol. 54, No. 12, Dec. 2006, pp. 4086-4099.

(Continued)

*Primary Examiner* — Patricia T Nguyen
(74) *Attorney, Agent, or Firm* — Withrow & Terranova, P.L.L.C.

(57) ABSTRACT

An RF communications system, which includes an RF power amplifier, an envelope tracking power supply, and supply control circuitry, is disclosed. The RF communications system operates in one of a normal operation mode and a calibration mode. During the calibration mode, the RF power amplifier receives and amplifies an RF input signal to provide an RF transmit signal using an envelope power supply signal, which is provided by the envelope tracking power supply. Further, the supply control circuitry controls the envelope tracking power supply to cause a sharp transition of the envelope power supply signal when a setpoint of the envelope power supply signal transitions through a setpoint threshold of the envelope power supply signal.

23 Claims, 11 Drawing Sheets

(51) Int. Cl.
*H03F 1/02* (2006.01)
*H03F 3/24* (2006.01)

(52) U.S. Cl.
CPC .. *H03F 2200/102* (2013.01); *H03F 2200/129* (2013.01); *H03F 2200/451* (2013.01); *H03F 2200/504* (2013.01)

(58) Field of Classification Search
USPC ................................................ 330/127, 297
See application file for complete search history.

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,339,041 A | 8/1994 | Nitardy |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,426,680 B1 | 7/2002 | Duncan et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,646,501 B1 | 11/2003 | Wessel |
| 6,658,445 B1 | 12/2003 | Gau et al. |
| 6,681,101 B1 | 1/2004 | Eidson et al. |
| 6,686,727 B2 | 2/2004 | Ledenev et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,026,868 B2 * | 4/2006 | Robinson .............. H03F 1/0227 330/10 |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,064,606 B2 | 6/2006 | Louis |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,453,711 B2 | 11/2008 | Yanagida et al. |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,863,828 B2 | 1/2011 | Melanson |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,917,105 B2 | 3/2011 | Drogi et al. |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |

(56) References Cited

U.S. PATENT DOCUMENTS

| | | |
|---|---|---|
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,358,113 B2 | 1/2013 | Cheng et al. |
| 8,362,837 B2 | 1/2013 | Koren et al. |
| 8,364,101 B2 | 1/2013 | Shizawa et al. |
| 8,446,135 B2 | 5/2013 | Chen et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,692,527 B2 * | 4/2014 | Ritamaki ............... H02M 7/42 323/269 |
| 8,693,676 B2 | 4/2014 | Xiao et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,651 B2 | 1/2015 | Jones |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 9,075,673 B2 | 7/2015 | Khlat et al. |
| 9,077,405 B2 | 7/2015 | Jones et al. |
| 9,099,961 B2 | 8/2015 | Kay et al. |
| 9,112,452 B1 | 8/2015 | Khlat |
| 2002/0071497 A1 | 6/2002 | Bengtsson et al. |
| 2002/0125869 A1 | 9/2002 | Groom et al. |
| 2002/0176188 A1 | 11/2002 | Ruegg et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0184713 A1 | 8/2005 | Xu et al. |
| 2005/0200407 A1 | 9/2005 | Arai et al. |
| 2005/0208907 A1 | 9/2005 | Yamazaki et al. |
| 2005/0258891 A1 | 11/2005 | Ito et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0114069 A1 | 6/2006 | Kojima et al. |
| 2006/0128324 A1 | 6/2006 | Tan et al. |
| 2006/0147062 A1 | 7/2006 | Niwa et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2006/0270366 A1 | 11/2006 | Rozenblit et al. |
| 2007/0008757 A1 | 1/2007 | Usui et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0054635 A1 | 3/2007 | Black et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0157745 A1 | 7/2008 | Nakata |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 * | 1/2009 | Eliezer ............... H03F 1/0211 455/127.1 |
| 2009/0015229 A1 | 1/2009 | Kotkalapoodi |
| 2009/0015299 A1 | 1/2009 | Ryu et al. |
| 2009/0039947 A1 | 2/2009 | Williams |
| 2009/0045872 A1 | 2/2009 | Kenington |
| 2009/0082006 A1 | 3/2009 | Pozsgay et al. |
| 2009/0097591 A1 | 4/2009 | Kim |

(56) References Cited

U.S. PATENT DOCUMENTS

| | | |
|---|---|---|
| 2009/0140706 A1 | 6/2009 | Taufik et al. |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2009/0326624 A1 | 12/2009 | Melse |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0027301 A1 | 2/2010 | Hoyerby |
| 2010/0045247 A1 | 2/2010 | Blanken et al. |
| 2010/0171553 A1 | 7/2010 | Okubo et al. |
| 2010/0181973 A1 | 7/2010 | Pauritsch et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084756 A1 | 4/2011 | Saman et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0148385 A1 | 6/2011 | North et al. |
| 2011/0193629 A1 | 8/2011 | Hou et al. |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2011/0304400 A1 | 12/2011 | Stanley |
| 2012/0025907 A1 | 2/2012 | Koo et al. |
| 2012/0025919 A1 | 2/2012 | Huynh |
| 2012/0032658 A1 | 2/2012 | Casey et al. |
| 2012/0034893 A1 | 2/2012 | Baxter et al. |
| 2012/0049818 A1 | 3/2012 | Hester |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0212197 A1 | 8/2012 | Fayed et al. |
| 2012/0236444 A1 | 9/2012 | Srivastava et al. |
| 2012/0244916 A1 | 9/2012 | Brown et al. |
| 2012/0249103 A1 | 10/2012 | Latham, II et al. |
| 2012/0269240 A1 | 10/2012 | Balteanu et al. |
| 2012/0274235 A1 | 11/2012 | Lee et al. |
| 2012/0299647 A1 | 11/2012 | Honjo et al. |
| 2012/0313701 A1 | 12/2012 | Khlat et al. |
| 2013/0024142 A1 | 1/2013 | Folkmann et al. |
| 2013/0034139 A1* | 2/2013 | Khlat ................ H03F 1/0227 375/224 |
| 2013/0038305 A1 | 2/2013 | Arno et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0231069 A1* | 9/2013 | Drogi .................. H04B 1/0475 455/114.3 |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0042999 A1 | 2/2014 | Barth et al. |
| 2014/0049321 A1 | 2/2014 | Gebeyehu et al. |
| 2014/0055197 A1 | 2/2014 | Khlat et al. |
| 2014/0057684 A1 | 2/2014 | Khlat |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184334 A1* | 7/2014 | Nobbe ................. H03F 1/0227 330/291 |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0266428 A1 | 9/2014 | Chiron et al. |
| 2014/0285164 A1 | 9/2014 | Oishi et al. |
| 2014/0306769 A1 | 10/2014 | Khlat et al. |
| 2015/0048891 A1 | 2/2015 | Rozek et al. |
| 2015/0180422 A1 | 6/2015 | Khlat et al. |
| 2015/0234402 A1 | 8/2015 | Kay et al. |
| 2015/0270806 A1 | 9/2015 | Wagh et al. |

FOREIGN PATENT DOCUMENTS

| | | |
|---|---|---|
| CN | 1518209 A | 8/2004 |
| CN | 1592089 A | 3/2005 |
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| CN | 102403967 A | 4/2012 |
| EP | 0755121 A2 | 1/1997 |
| EP | 1047188 A2 | 10/2000 |
| EP | 1317105 A1 | 6/2003 |
| EP | 1492227 A1 | 12/2004 |

(56) References Cited

FOREIGN PATENT DOCUMENTS

| | | | |
|---|---|---|---|
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| JP | 2010166157 A | 7/2010 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

Examination Report for European Patent Application No. 14190851.7, mailed May 2, 2016, 5 pages.
Non-Final Office Action for U.S. Appl. No. 13/689,883, mailed Apr. 20, 2016, 13 pages.
Notice of Allowance and Examiner Initiated Interview Summary for U.S. Appl. No. 13/661,227, mailed May 13, 2016, 10 pages.
Non-Final Office Action for U.S. Appl. No. 13/714,600, mailed May 4, 2016, 14 pages.
Final Office Action for U.S. Appl. No. 13/876,518, mailed Jun. 2, 2016, 14 pages.
Combined Search and Examination Report for European Patent Application No. 12725911.7, mailed Jun. 15, 2016, 14 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
International Search Report and Written Opinion for PCT/US2014/028178, mailed Sep. 30, 2014, 17 pages.
Yun, Hu et al., "Study of envelope tracking power amplifier design," Journal of Circuits and Systems, vol. 15, No. 6, ' Dec. 2010, pp. 6-10.
Notice of Allowance for U.S. Appl. No. 13/948,291, mailed Jul. 17, 2015, 8 pages.
Corrected Notice of Allowance for U.S. Appl. No. 13/297,470, mailed Jun. 5, 2015, 11 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 13/747,725, mailed Sep. 1, 2015, 9 pages.
Notice of Allowance for U.S. Appl. No. 13/747,749, mailed Jun. 4, 2015, 8 pages.
Notice of Allowance for U.S. Appl. No. 14/072,120, mailed Jul. 30, 2015, 7 pages.
Notice of Allowance for U.S. Appl. No. 14/027,416, mailed Aug. 11, 2015, 9 pages.
Notice of Allowance for U.S. Appl. No. 13/689,940, mailed Aug. 3, 2015, 6 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
First Office Action and Search Report for Chinese Patent Application No. 201280007941.7, issued May 13, 2015, 13 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.
Notice of Allowance for U.S. Appl. No. 13/661,164, mailed Oct. 21, 2015, 7 pages.

(56) References Cited

OTHER PUBLICATIONS

Non-Final Office Action for U.S. Appl. No. 14/254,215, mailed Oct. 15, 2015, 5 pages.
First Office Action for Chinese Patent Application No. 201180067293.X, mailed Aug. 6, 2015, 13 pages.
Notice of Allowance for U.S. Appl. No. 14/072,225, mailed Feb. 3, 2016, 7 pages.
First Office Action for Chinese Patent Application No. 201280042523.1, issued Dec. 4, 2015, 12 pages
Final Office Action for U.S. Appl. No. 13/661,227, mailed Feb. 9, 2016, 28 pages.
Advisory Action for U.S. Appl. No. 14/082,629, mailed Jan. 22, 2016, 3 pages.
Non-Final Office Action for U.S. Appl. No. 13/876,518, mailed Jan. 20, 2016, 16 pages.
Notice of Allowance for U.S. Appl. No. 14/163,256, mailed Feb. 10, 2016, 8 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Repoqrt on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Advisory Action for U.S. Appl. No. 13/689,883, mailed Mar. 4, 2016, 3 pages.
First Office Action for Chinese Patent Application No. 201280052739.6, mailed Mar. 3, 2016, 31 pages.
Advisory Action for U.S. Appl. No. 13/714,600, mailed Mar. 14, 2016, 3 pages.
Notice of Allowance for U.S. Appl. No. 13/689,922, mailed Mar. 18, 2016, 9 pages.
Notice of Allowance for U.S. Appl. No. 14/101,770, mailed Apr. 11, 2016, 6 pages.
Notice of Allowance for U.S. Appl. No. 14/151,167, mailed Mar. 4, 2016, 7 pages.
Non-Final Office Action for U.S. Appl. No. 14/082,629, mailed Mar. 16, 2016, 23 pages.
Notice of Allowance for U.S. Appl. No. 14/702,192, mailed Feb. 22, 2016, 8 pages.
Notice of Allowance for U.S. Appl. No. 14/254,215, mailed Feb. 18, 2016, 7 pages.
Notice of Allowance for U.S. Appl. No. 14/458,341, mailed Feb. 18, 2016, 6 pages.
Communication under Rule 164(2)(a) EPC for European Patent Application No. 12725911.7, mailed Feb. 17, 2016, 8 pages.
Author Unknown, "Automatically," Definition, Dictionary.com Unabridged, 2015, pp. 1-6, http://dictionary.reference.com/browse/automatically.

(56) References Cited

OTHER PUBLICATIONS

Final Office Action for U.S. Appl. No. 13/689,883, mailed Dec. 23, 2015, 12 pages.
Final Office Action for U.S. Appl. No. 13/714,600, mailed Dec. 24, 2015, 15 pages.
Notice of Allowance for U.S. Appl. No. 13/747,725, mailed Oct. 28, 2015, 9 pages.
Advisory Action for U.S. Appl. No. 13/689,922, mailed Dec. 18, 2015, 3 pages.
Notice of Allowance for U.S. Appl. No. 13/727,911, mailed Nov. 10, 2015, 8 pages.
Notice of Allowance for U.S. Appl. No. 14/163,229, mailed Nov. 5, 2015, 8 pages.
Final Office Action for U.S. Appl. No. 14/163,256, mailed Nov. 2, 2015, 10 pages.
Corrected Notice of Allowability for U.S. Appl. No. 13/689,940, mailed Nov. 17, 2015, 4 pages.
Final Office Action for U.S. Appl. No. 14/082,629, mailed Nov. 4, 2015, 17 pages.
Non-Final Office Action for U.S. Appl. No. 14/458,341, mailed Nov. 12, 2015, 5 pages.
Non-Final Office Action for U.S. Appl. No. 12/836,307, mailed Sep. 25, 2014, 5 pages.
Notice of Allowance for U.S. Appl. No. 12/836,307, mailed Mar. 2, 2015, 6 pages.
Notice of Allowance for U.S. Appl. No. 13/948,291, mailed Feb. 11, 2015, 7 pages.
First Office Action for Chinese Patent Application No. 201180030273.5, issued Dec. 3, 2014, 15 pages (with English translation).
European Examination Report for European Patent Application No. 14162682.0, mailed May 22, 2015, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Notice of Allowance for U.S. Appl. No. 14/022,858, mailed Feb. 17, 2015, 7 pages.
Notice of Allowance for U.S. Appl. No. 13/367,973, mailed Sep. 15, 2014, 7 pages.
Notice of Allowance for U.S. Appl. No. 14/072,140, mailed Dec. 2, 2014, 8 pages.
Extended European Search Report for European Patent Application No. 14190851.7, issued Mar. 5, 2015, 6 pages.
Notice of Allowance for U.S. Appl. No. 14/072,225, mailed Jan. 22, 2015, 7 pages.
Non-Final Office Action for U.S. Appl. No. 14/122,852, mailed Feb. 27, 2015, 5 pages.
First Office Action for Chinese Patent Application No. 201280026559.0, issued Nov. 3, 2014, 14 pages. (with English translation).
Extended European Search Report for European Patent Application No. 12794149.0, issued Oct. 29, 2014, 6 pages.
Notice of Allowance for U.S. Appl. No. 13/486,012, mailed Nov. 21, 2014, 8 pages.
Notice of Allowance for U.S. Appl. No. 13/647,815, mailed Sep. 19, 2014, 6 pages.
Final Office Action for U.S. Appl. No. 13/689,883, mailed Jan. 2, 2015, 13 pages.
Advisory Action for U.S. Appl. No. 13/689,883, mailed Apr. 20, 2015, 3 pages.
Non-Final Office Action for U.S. Appl. No. 13/661,227, mailed Sep. 29, 2014, 24 pages.
Final Office Action for U.S. Appl. No. 13/661,227, mailed Feb. 6, 2015, 24 pages.
Advisory Action for U.S. Appl. No. 13/661,227, mailed May 12, 2015, 3 pages.
Notice of Allowance for U.S. Appl. No. 13/690,187, mailed Dec. 19, 2014, 8 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Final Office Action for U.S. Appl. No. 13/714,600, mailed Mar. 10, 2015, 14 pages.
Advisory Action for U.S. Appl. No. 13/714,600, mailed May 26, 2015, 3 pages.
Notice of Allowance for U.S. Appl. No. 13/747,694, mailed Dec. 22, 2014, 9 pages.
Notice of Allowance for U.S. Appl. No. 13/914,888, mailed Oct. 17, 2014, 10 pages.
Notice of Allowance for U.S. Appl. No. 13/951,976, mailed Dec. 26, 2014, 9 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Non-Final Office Action for U.S. Appl. No. 14/056,292, mailed Mar. 6, 2015, 8 pages.
Non-Final Office Action for U.S. Appl. No. 13/747,725, mailed Oct. 7, 2014, 6 pages.
Notice of Allowance for U.S. Appl. No. 13/747,725, mailed Feb. 2, 2015, 10 pages.
Notice of Allowance for U.S. Appl. No. 13/747,725, mailed May 13, 2015, 9 pages.
Non-Final Office Action for U.S. Appl. No. 13/747,749, mailed Nov. 12, 2014, 32 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Non-Final Office Action for U.S. Appl. No. 13/689,940, mailed May 14, 2015, 7 pages.
International Search Report and Written Opinion for PCT/US2014/012927, mailed Sep. 30, 2014, 11 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.

(56) References Cited

OTHER PUBLICATIONS

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

Non-final Office Action for U.S. Appl. No. 11/113,873, now U.S. Pat. No. 7,773,691, mailed Feb. 1, 2008, 17 pages.

Final Office Action for U.S. Appl. No. 11/113,873, now U.S. Pat. No. 7,773,691, mailed Jul. 30, 2008, 19 pages.

Non-final Office Action for U.S. Appl. No. 11/113,873, now U.S. Pat. No. 7,773,691, mailed Nov. 26, 2008, 22 pages.

Final Office Action for U.S. Appl. No. 11/113,873, now U.S. Pat. No. 7,773,691, mailed May 4, 2009, 20 pages.

Non-final Office Action for U.S. Appl. No. 11/113,873, now U.S. Pat. No. 7,773,691, mailed Feb. 3, 2010, 21 pages.

Notice of Allowance for U.S. Appl. No. 11/113,873, now U.S. Pat. No. 7,773,691, mailed Jun. 9, 2010, 7 pages.

International Search Report for PCT/US06/12619, mailed May 8, 2007, 2 pages.

Extended European Search Report for application 06740532.4, mailed Dec. 7, 2010, 7 pages.

Non-final Office Action for U.S. Appl. No. 12/112,006, mailed Apr. 5, 2010, 6 pages.

Notice of Allowance for U.S. Appl. No. 12/112,006, mailed Jul. 19, 2010, 6 pages.

Non-Final Office Action for U.S. Appl. No. 12/836,307, mailed Nov. 5, 2013, 6 pages.

Notice of Allowance for U.S. Appl. No. 12/836,307, mailed May 5, 2014, 6 pages.

Non-final Office Action for U.S. Appl. 13/089,917, mailed Nov. 23, 2012, 6 pages.

Examination Report for European Patent Application No. 11720630, mailed Aug. 16, 2013, 5 pages.

Examination Report for European Patent Application No. 11720630.0, issued Mar. 18, 2014, 4 pages.

European Search Report for European Patent Application No. 14162682.0, issued Aug. 27, 2014, 7 pages.

International Search Report for PCT/US11/033037, mailed Aug. 9, 2011, 10 pages.

International Preliminary Report on Patentability for PCT/US2011/033037, mailed Nov. 1, 2012, 7 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 8 pages.

International Search Report for PCT/US2011/044857, mailed Oct. 24, 2011, 10 pages.

International Preliminary Report on Patentability for PCT/US2011/044857, mailed Mar. 7, 2013, 6 pages.

Non-final Office Action for U.S. Appl. No. 13/218,400, mailed Nov. 8, 2012, 7 pages.

Notice of Allowance for U.S. Appl. No. 13/218,400, mailed Apr. 11, 2013, 7 pages.

International Search Report for PCT/US11/49243, mailed Dec. 22, 2011, 9 pages.

International Preliminary Report on Patentability for PCT/US11/49243, mailed Nov. 13, 2012, 33 pages.

International Search Report for PCT/US2011/054106, mailed Feb. 9, 2012, 11 pages.

International Preliminary Report on Patentability for PCT/US2011/054106, mailed Apr. 11, 2013, 8 pages.

Notice of Allowance for U.S. Appl. No. 13/297,490, mailed Feb. 27, 2014, 7 pages.

Invitation to Pay Additional Fees for PCT/US2011/061007, mailed Feb. 13, 2012, 7 pages.

International Search Report for PCT/US2011/061007, mailed Aug. 16, 2012, 16 pages.

International Preliminary Report on Patentability for PCT/US2011/061007, mailed May 30, 2013, 11 pages.

Non-Final Office Action for U.S. Appl. No. 13/297,470, mailed May 8, 2013, 15 pages.

Notice of Allowance for U.S. Appl. No. 14/638,374, mailed Aug. 30, 2016, 7 pages.

Notice of Allowance for U.S. Appl. 13/689,883, mailed Jul. 27, 2016, 9 pages.

Final Office Action for U.S. Appl. No. 14/082,629, mailed Sep. 8, 2016, 13 pages.

Advisory Action for U.S. Appl. No. 13/876,518, mailed Aug. 15, 2016, 3 pages.

Final Office Action for U.S. Appl. No. 13/714,600, mailed Oct. 5, 2016, 15 pages.

Non-Final Office Action and Examiner Initiated Interview Summary for U.S. Appl. No. 13/876,518, mailed Sep. 22, 2016, 18 pages.

First Office Action for Chinese Patent Application No. 201380039592.1, mailed Oct. 31, 2016, 13 pages.

Invitation Pursuant to Rule 137(4) EPC and Article 94(3) EPC for European Patent Application No. 12725911.7, mailed Jan. 2, 2017, 2 pages.

Advisory Action for U.S. Appl. No. 13/714,600, mailed Dec. 16, 2016, 3 pages.

Notice of Allowance and Examiner Initiated Interview Summary for U.S. Appl. No. 14/082,629, mailed Dec. 7, 2016, 11 pages.

(56) References Cited

OTHER PUBLICATIONS

Non-Final Office Action for U.S. Appl. No. 15/142,634, mailed Jan. 20, 2017, 6 pages.

* cited by examiner

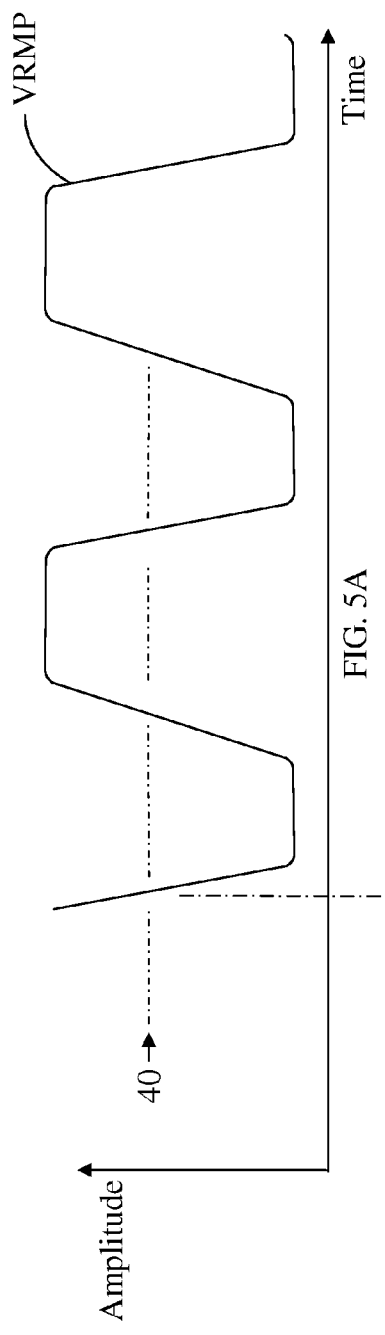
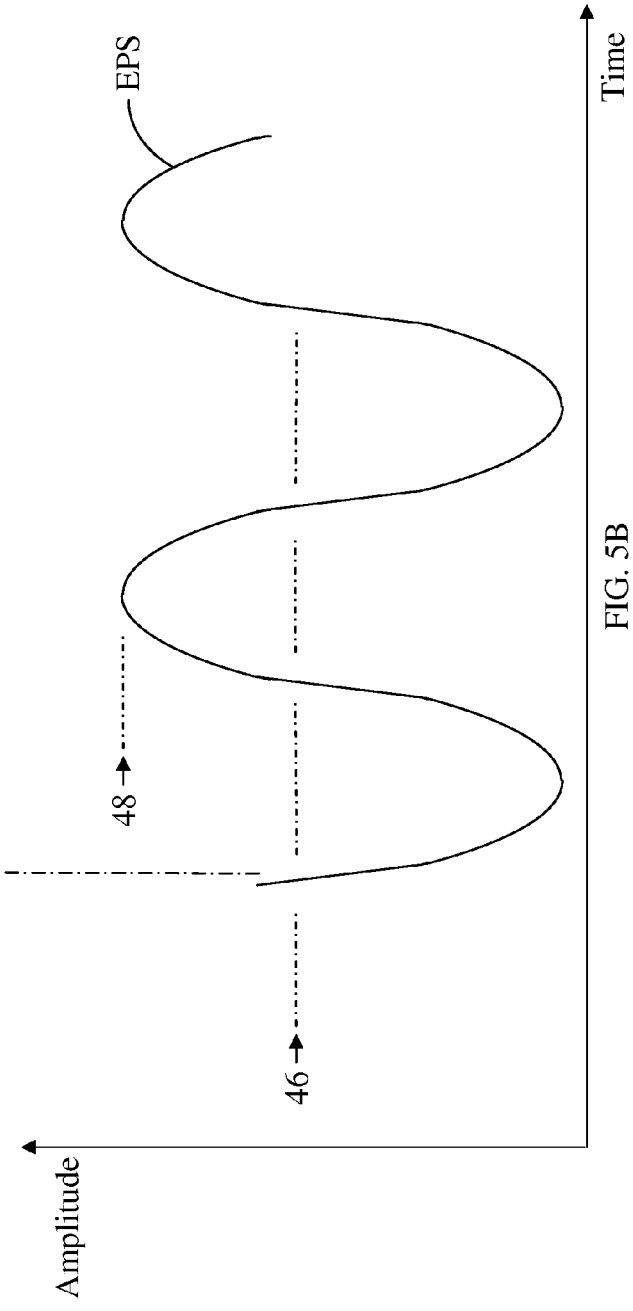
FIG. 5A
FIG. 5B

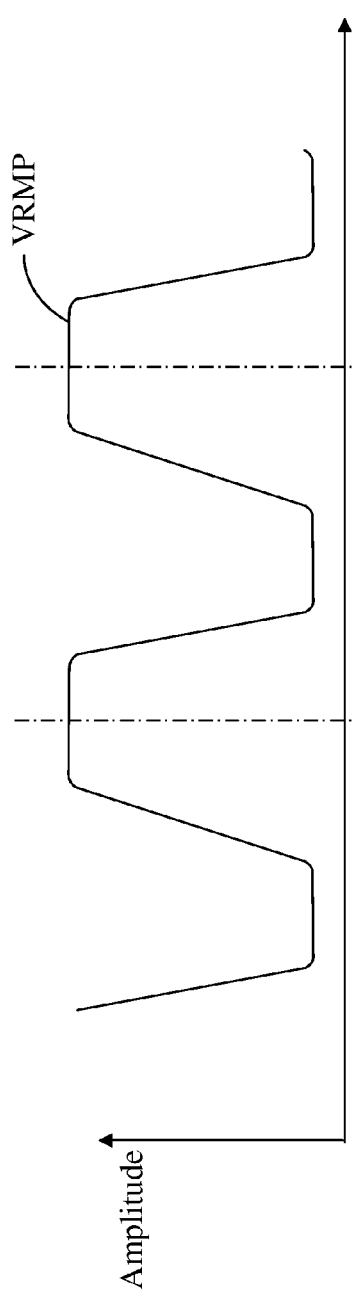
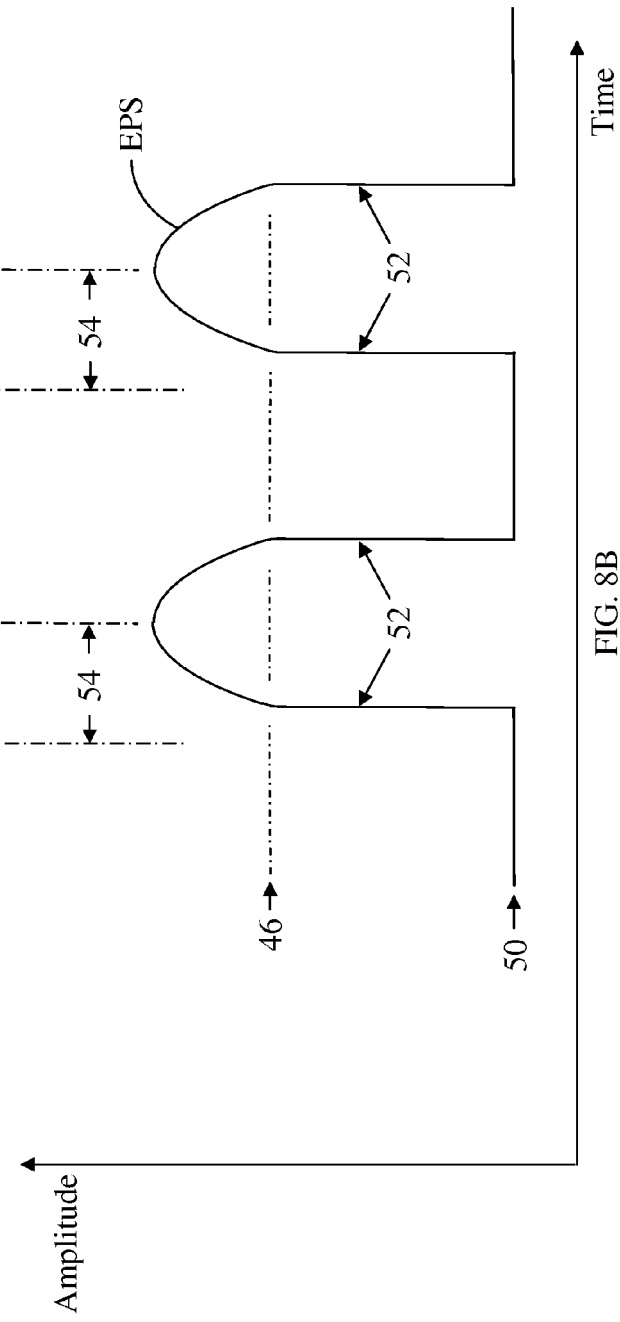
FIG. 8A
FIG. 8B

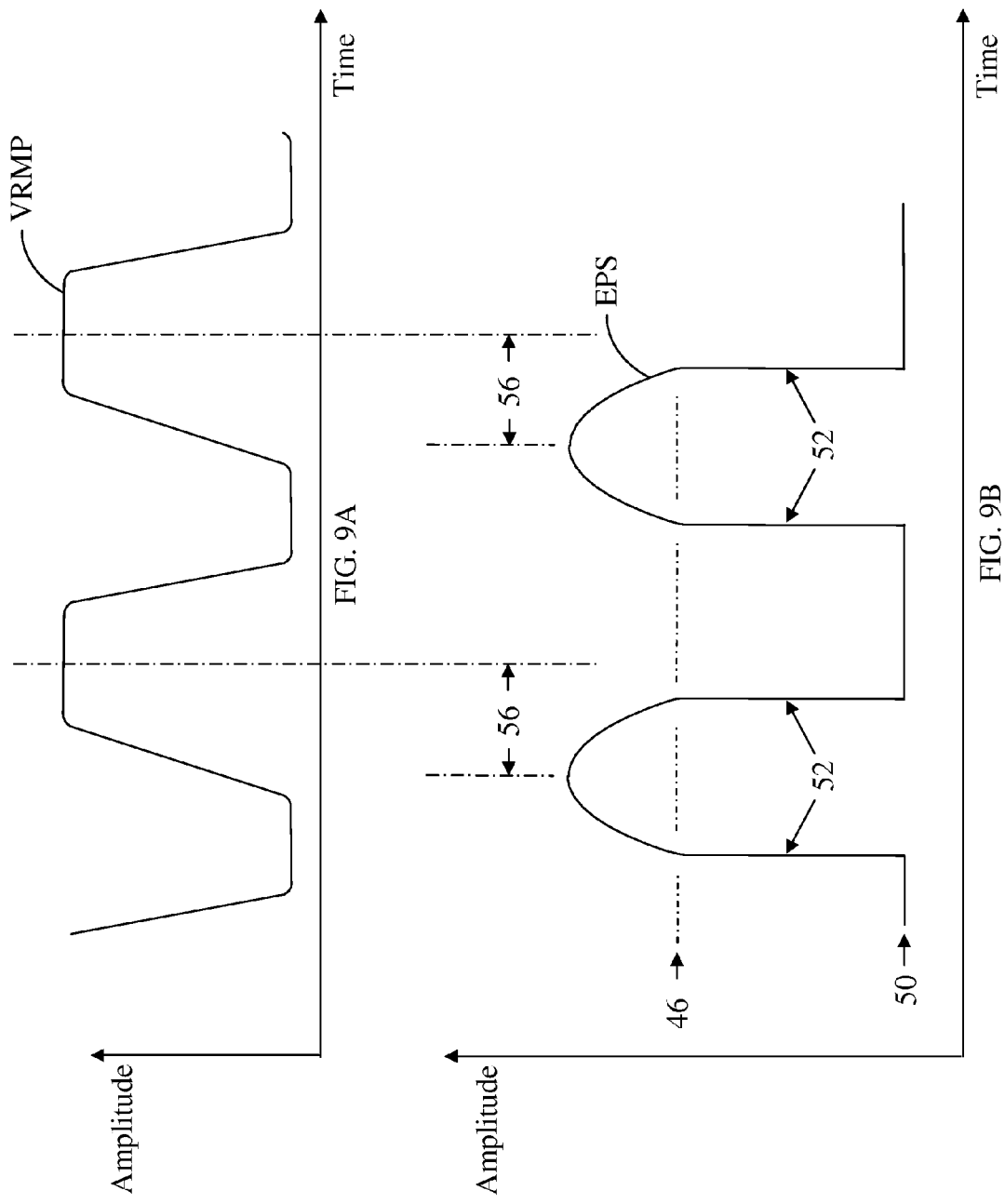

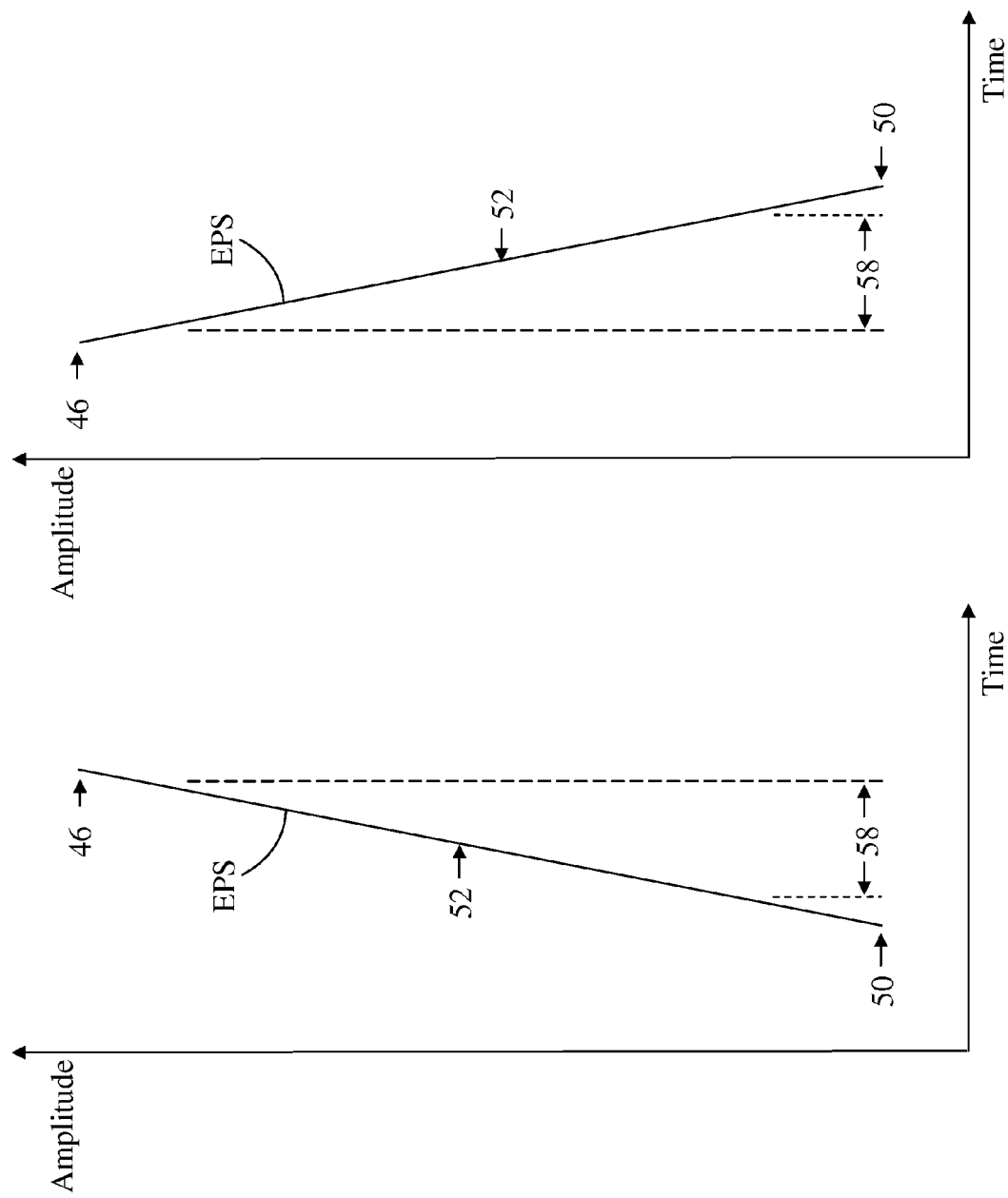

GROUP DELAY CALIBRATION OF RF ENVELOPE TRACKING

RELATED APPLICATIONS

This application claims the benefit of U.S. provisional patent application No. 62/019,530 filed Jul. 1, 2014, the disclosure of which is incorporated herein by reference in its entirety.

FIELD OF THE DISCLOSURE

Embodiments of the present disclosure relate to switching power supplies, analog power supplies, and radio frequency (RF) power amplifiers, any or all of which may be used in RF communications systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

An RF communications system, which includes an RF power amplifier, an envelope tracking power supply, and supply control circuitry, is disclosed according to one embodiment of the present disclosure. The RF communications system operates in one of a normal operation mode and a calibration mode. During the calibration mode, the RF power amplifier receives and amplifies an RF input signal to provide an RF transmit signal using an envelope power supply signal, which is provided by the envelope tracking power supply. Further, the supply control circuitry controls the envelope tracking power supply to cause a sharp transition of the envelope power supply signal when a setpoint of the envelope power supply signal transitions through a setpoint threshold of the envelope power supply signal.

By sharply transitioning the envelope power supply signal during the calibration mode, a delay mismatch between the envelope power supply signal and the RF input signal may be more accurately determined, thereby improving alignment of an envelope of the RF transmit signal with the envelope power supply signal during the normal operation mode. In one embodiment of the envelope power supply signal, a maximum rate of change of the envelope power supply signal during the sharp transition is greater than a maximum rate of change of the envelope power supply signal during the normal operation mode.

Certain emerging wireless communications protocols require increasingly larger modulation bandwidths of RF transmit signals. Such modulation bandwidths may impose increasingly tight alignment requirements between an RF transmit signal and an envelope power supply signal. Therefore, there is a need for calibration techniques to accurately align the envelope power supply signal with the RF transmit signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 5A and 5B are graphs illustrating the envelope power supply control signal and the envelope power supply signal shown in FIG. 1 during a calibration mode, according to one embodiment of the envelope power supply control signal and the envelope power supply signal, respectively.

FIGS. 8A and 8B are graphs illustrating the envelope power supply control signal and the envelope power supply signal shown in FIG. 1 during the calibration mode, according to an additional embodiment of the envelope power supply control signal and the envelope power supply signal, respectively.

FIGS. 9A and 9B are graphs illustrating the envelope power supply control signal and the envelope power supply signal shown in FIG. 1 during the calibration mode, according to another embodiment of the envelope power supply control signal and the envelope power supply signal, respectively.

FIGS. 10A and 10B are graphs illustrating transition times of the envelope power supply signal during a sharp transition from a target magnitude to a setpoint threshold and during a sharp transition from the setpoint threshold to the target magnitude, respectively, according to one embodiment of the envelope power supply signal.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

An RF communications system, which includes an RF power amplifier, an envelope tracking power supply, and supply control circuitry, is disclosed according to one embodiment of the present disclosure. The RF communications system operates in one of a normal operation mode and a calibration mode. During the calibration mode, the RF power amplifier receives and amplifies an RF input signal to provide an RF transmit signal using an envelope power supply signal, which is provided by the envelope tracking power supply. Further, the supply control circuitry controls the envelope tracking power supply to cause a sharp transition of the envelope power supply signal when a setpoint of the envelope power supply signal transitions through a setpoint threshold of the envelope power supply signal.

By sharply transitioning the envelope power supply signal during the calibration mode, a delay mismatch between the envelope power supply signal and the RF input signal may be more accurately determined, thereby improving alignment of an envelope of the RF transmit signal with the envelope power supply signal during the normal operation mode. In one embodiment of the envelope power supply signal, a maximum rate of change of the envelope power supply signal during the sharp transition is greater than a maximum rate of change of the envelope power supply signal during the normal operation mode.

Certain emerging wireless communications protocols require increasingly larger modulation bandwidths of RF transmit signals. Such modulation bandwidths may impose increasingly tight alignment requirements between an RF transmit signal and an envelope power supply signal. Therefore, there is a need for calibration techniques to accurately align the envelope power supply signal with the RF transmit signal.

For example, with certain wireless local area network (WLAN) protocols, the RF transmit signal and the envelope power supply signal need to be aligned within 1.0 nanoseconds, or less. With certain multiple carrier long term evolution (LTE) protocols, the RF transmit signal and the envelope power supply signal need to be aligned within 0.5 nanoseconds, or less. With certain high frequency WLAN protocols, the RF transmit signal and the envelope power supply signal need to be aligned within 0.25 nanoseconds, or less.

Figure 1:
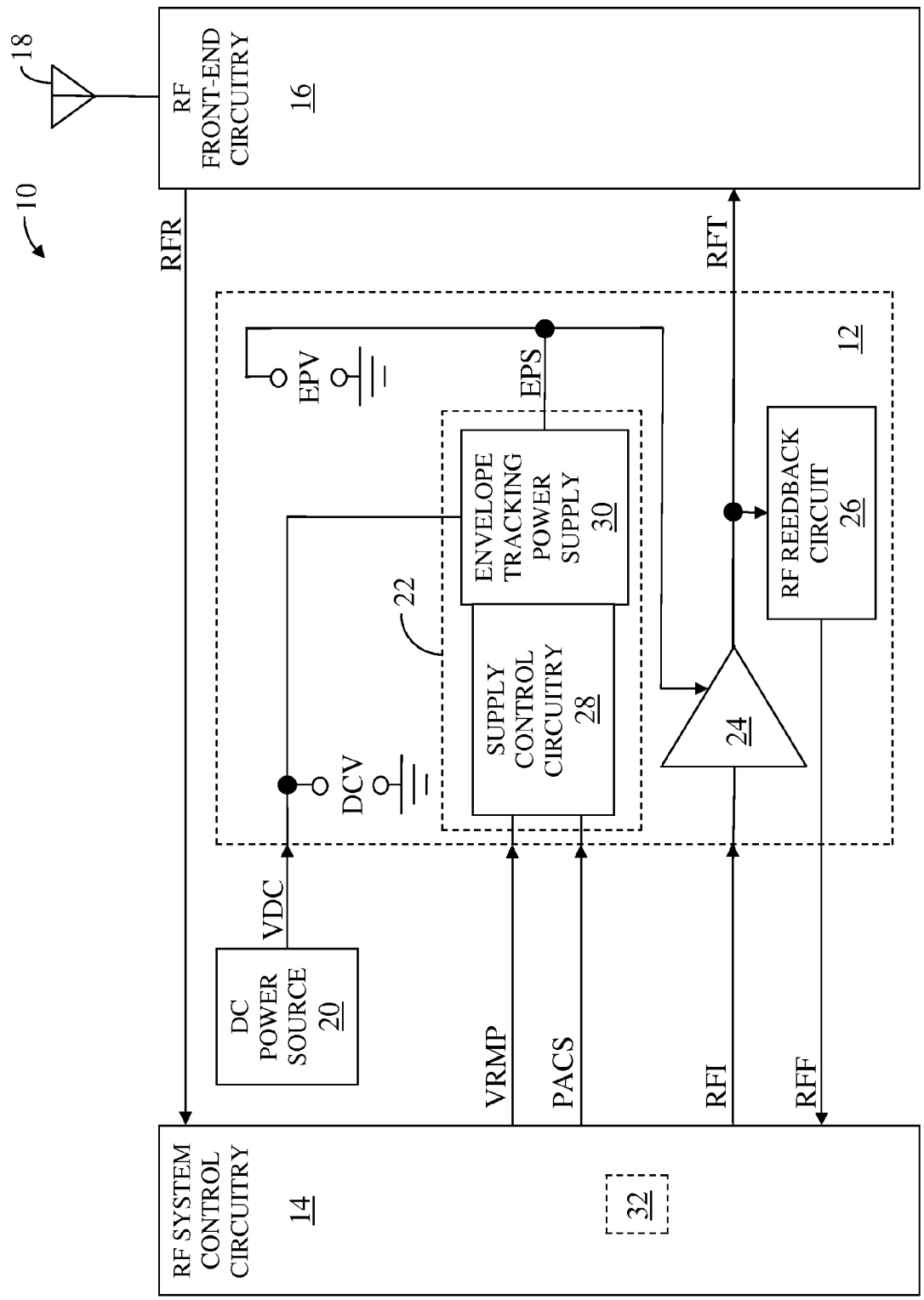
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes an envelope tracking integrated circuit (ETIC) 22, an RF power amplifier (RF PA) 24, and an RF feedback circuit 26. The ETIC 22 includes supply control circuitry 28 and an envelope tracking power supply 30. The RF system control circuitry 14 includes delay calibration data 32.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the supply control circuitry 28. The RF system control circuitry 14 provides an RF input signal RFI to the RF PA 24. The DC power source 20 provides a DC source signal VDC to the envelope tracking power supply 30. The DC source signal VDC has a DC source voltage DCV. In one embodiment of the DC power source 20, the DC power source 20 is a battery.

The supply control circuitry 28 is coupled to the envelope tracking power supply 30. The envelope tracking power supply 30 provides an envelope power supply signal EPS to the RF PA 24 based on the envelope power supply control signal VRMP. The envelope power supply signal EPS has an envelope power supply voltage EPV. The DC source signal VDC provides power to the envelope tracking power supply 30. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18.

In one embodiment of the RF feedback circuit 26, the RF feedback circuit 26 receives the RF transmit signal RFT and provides an RF feedback signal RFF to the RF system control circuitry 14 based on the RF transmit signal RFT. In one embodiment of the RF feedback circuit 26, the RF feedback circuit 26 comprises an RF detector, such that the RF feedback signal RFF is based on detecting the RF transmit signal RFT. In an alternate embodiment of the RF feedback circuit 26, the RF feedback circuit 26 comprises an RF attenuator, such that the RF feedback signal RFF is based on attenuating the RF transmit signal RFT. In one embodiment of the RF transmitter circuitry 12, the supply control circuitry 28 configures the RF transmitter circuitry 12 based on the transmitter configuration signal PACS.

In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF communications system 10, the RF communications system 10 operates in one of a normal operation mode and a calibration mode. In one embodiment of the RF system control circuitry 14, during the normal operation mode and during the calibration mode, the RF system control circuitry 14 provides the RF input signal RFI and the envelope power supply control signal VRMP, such that the RF PA 24 receives and amplifies the RF input signal RFI to provide the RF transmit signal RFT using the envelope power supply signal EPS, which is based on the envelope power supply control signal VRMP.

In one embodiment of the RF communications system 10, during the calibration mode, the RF system control circuitry 14 measures a delay mismatch between the envelope power supply signal EPS and the RF input signal RFI using the RF feedback signal RFF. As such, the RF feedback signal RFF is representative of the delay mismatch between the envelope power supply signal EPS and the RF input signal RFI. In one embodiment of the delay calibration data 32, the delay calibration data 32 is based on the RF feedback signal RFF. In one embodiment of the RF system control circuitry 14, during the calibration mode, the RF system control circuitry 14 provides the RF input signal RFI and the envelope power supply control signal VRMP, such that the RF PA 24 receives and amplifies the RF input signal RFI to provide the RF transmit signal RFT using the envelope power supply signal EPS, which is based on the envelope power supply control signal VRMP.

Figure 2:
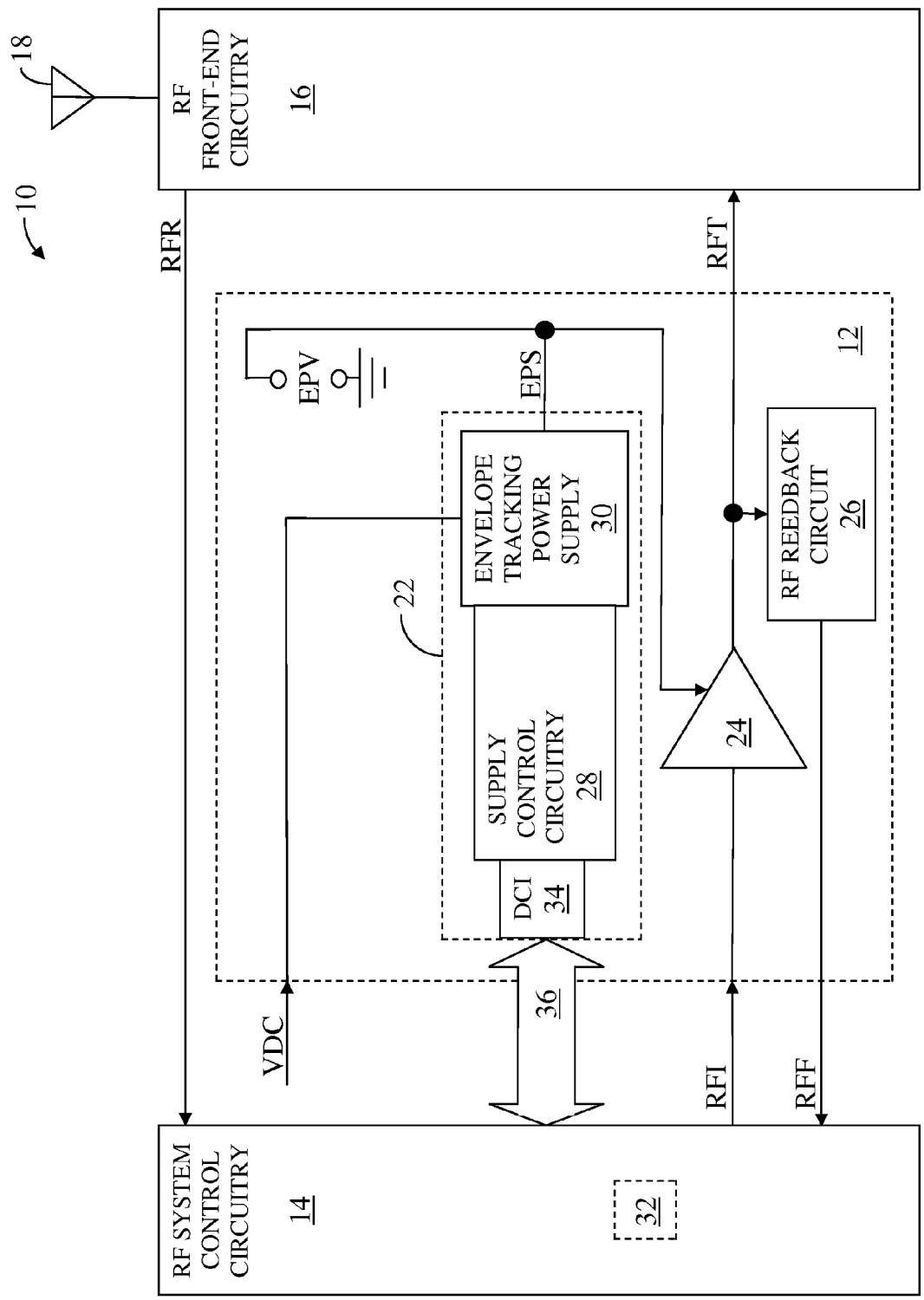
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2; the RF transmitter circuitry 12 further includes a digital communications interface 34, which is coupled between the supply control circuitry 28 and a digital communications bus 36. The digital communications bus 36 is also coupled to the RF system control circuitry 14. As such, the RF system control circuitry 14 provides the envelope power supply control signal VRMP (FIG. 1) and the transmitter configuration signal PACS (FIG. 1) to the supply control circuitry 28 via the digital communications bus 36 and the digital communications interface 34.

Figure 3:
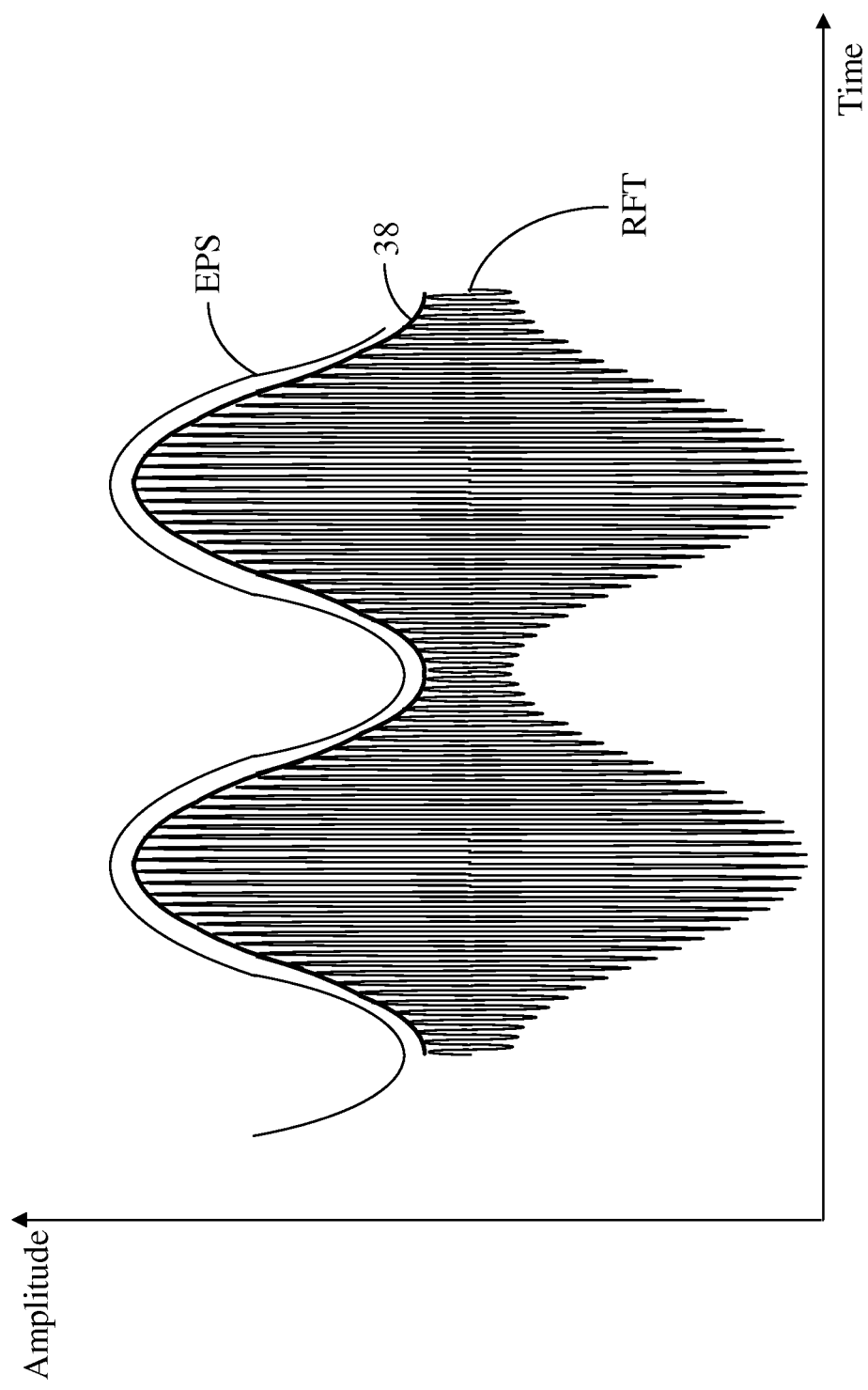
FIG. 3 is a graph illustrating an RF transmit signal and an envelope power supply signal shown in FIGS. 1 and 2, according to one embodiment of the RF transmit signal and the envelope power supply signal.

FIG. 3 is a graph illustrating the RF transmit signal RFT and the envelope power supply signal EPS shown in FIGS. 1 and 2, according to one embodiment of the RF transmit signal RFT and the envelope power supply signal EPS. FIG. 3 is described based on the RF communications system 10 illustrated in FIGS. 1 and 2. In one embodiment of the RF communications system 10, the delay calibration data 32 is based on a group delay mismatch between the RF transmit signal RFT and the envelope power supply signal EPS.

In this regard, during the normal operation mode, the RF system control circuitry 14 uses the delay calibration data 32 to approximately align an envelope 38 of the RF transmit signal RFT with the envelope power supply signal EPS as illustrated in FIG. 3. As such, the RF system control circuitry 14 may make timing adjustments to the RF input signal RFI, the envelope power supply control signal VRMP, or both.

Figure 4A:
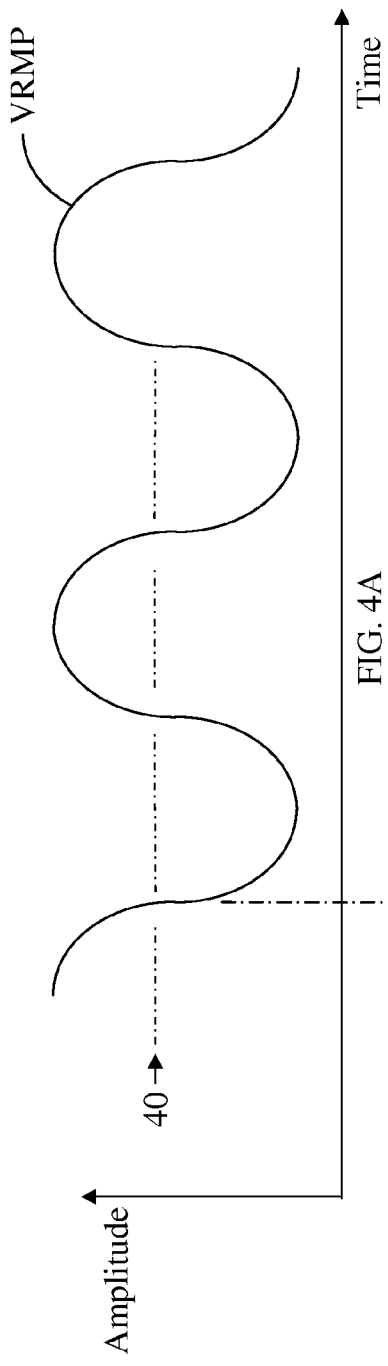
FIGS. 4A and 4B are graphs illustrating an envelope power supply control signal and the envelope power supply signal shown in FIG. 1 during a normal operation mode, according to one embodiment of the envelope power supply control signal and the envelope power supply signal, respectively.
Figure 4B:
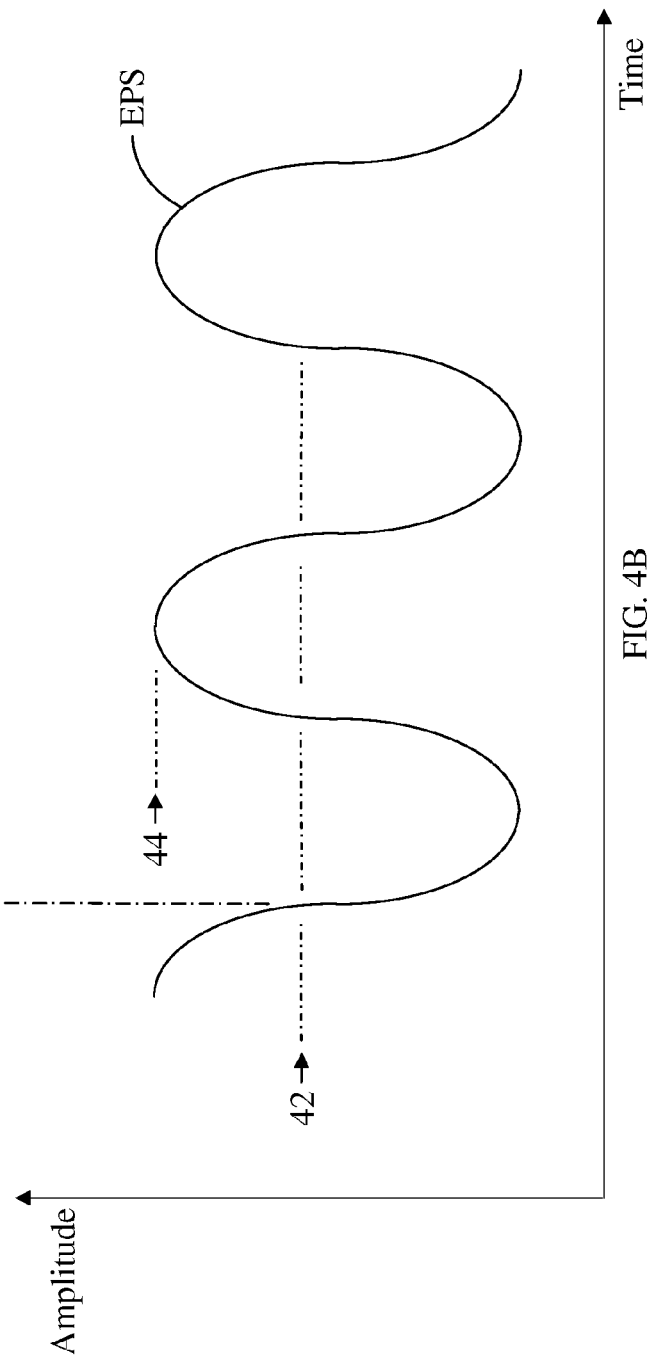

FIGS. 4A and 4B are graphs illustrating the envelope power supply control signal VRMP and the envelope power supply signal EPS shown in FIG. 1 during the normal operation mode, according to one embodiment of the envelope power supply control signal VRMP and the envelope power supply signal EPS, respectively. FIGS. 4A and 4B are described based on the RF communications system 10 illustrated in FIG. 1. The envelope power supply control signal VRMP is representative of a setpoint of the envelope power supply signal EPS. As such, the envelope power supply control signal VRMP and the envelope power supply signal EPS illustrated in FIGS. 4A and 4B are about phase-aligned with one another. Any group delay in the illustrated embodiments between the envelope power supply control signal VRMP and the envelope power supply signal EPS are not shown. The envelope power supply signal EPS shown in FIG. 4B follows the envelope power supply control signal VRMP illustrated in FIG. 4A. Further the envelope power supply signal EPS shown in FIG. 4B is similar to the envelope power supply signal EPS shown in FIG. 3.

The envelope power supply control signal VRMP has a control magnitude 40, which correlates with a setpoint magnitude 42 of the envelope power supply signal EPS. Further, during the normal operation mode, the envelope power supply signal EPS has a normal envelope peak 44.

FIGS. 5A and 5B are graphs illustrating the envelope power supply control signal VRMP and the envelope power supply signal EPS shown in FIG. 1 during the calibration mode, according to one embodiment of the envelope power supply control signal VRMP and the envelope power supply signal EPS, respectively. FIGS. 5A and 5B are described based on the RF communications system 10 illustrated in FIG. 1. The envelope power supply control signal VRMP is representative of the setpoint of the envelope power supply signal EPS. As such, the envelope power supply control signal VRMP and the envelope power supply signal EPS illustrated in FIGS. 5A and 5B are about phase-aligned with one another. Any group delay in the illustrated embodiments between the envelope power supply control signal VRMP and the envelope power supply signal EPS are not shown. The envelope power supply signal EPS shown in FIG. 5B is based on the envelope power supply control signal VRMP illustrated in FIG. 5A.

A shape of the envelope power supply control signal VRMP illustrated in FIG. 5A is a rough square-wave with sloped transitions. This shape may provide easier detection of delay mismatch between the RF transmit signal RFT and the envelope power supply signal EPS by the RF feedback circuit 26. Due to bandwidth limitations in the envelope tracking power supply 30, a shape of the envelope power supply signal EPS illustrated in FIG. 5B has rounded corners. The envelope power supply control signal VRMP has the control magnitude 40, which correlates with a setpoint threshold 46 of the envelope power supply signal EPS. During the calibration mode, the envelope power supply signal EPS has a calibration envelope peak 48.

In one embodiment of the envelope power supply signal EPS, a maximum value of the normal envelope peak 44 (FIG. 4B) is about equal to a maximum value of the calibration envelope peak 48. In one embodiment of the RF communications system 10, during the calibration mode, the calibration envelope peak 48 has the maximum value of the calibration envelope peak 48. In a first embodiment of the envelope power supply signal EPS, the maximum value of the calibration envelope peak 48 is equal to about 4.5 volts. In a second embodiment of the envelope power supply signal EPS, the maximum value of the calibration envelope peak 48 is between about 5 volts and 6 volts. In a third embodiment of the envelope power supply signal EPS, the maximum value of the calibration envelope peak 48 is between about 4 volts and 5 volts. In a fourth embodiment of the envelope power supply signal EPS, the maximum value of the calibration envelope peak 48 is between about 3 volts and 4 volts.

Figure 6A:
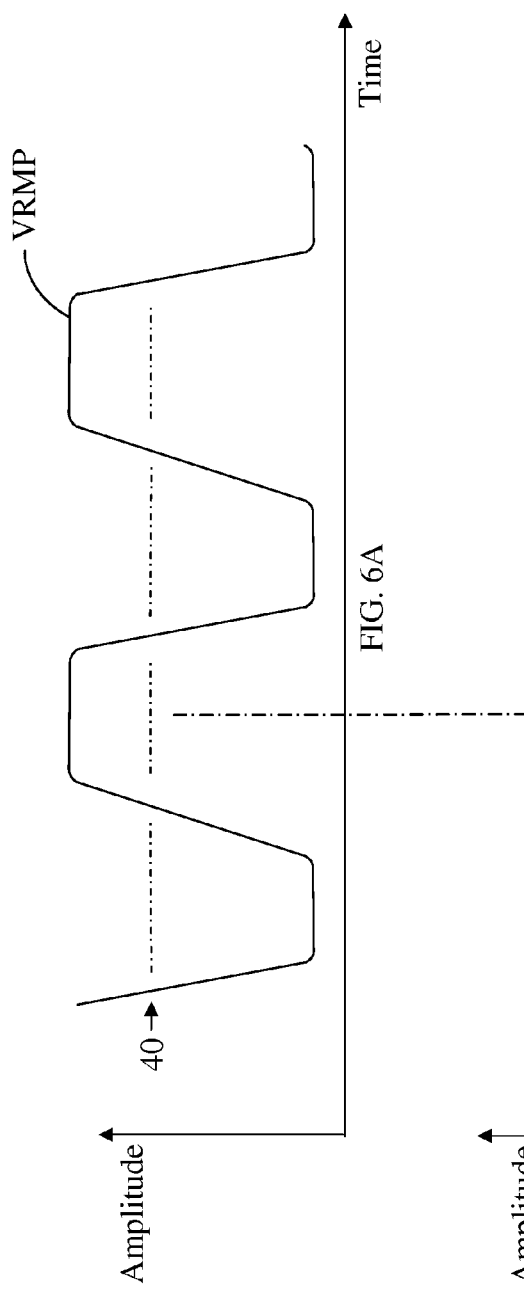
FIGS. 6A and 6B are graphs illustrating the envelope power supply control signal and the envelope power supply signal shown in FIG. 1 during the calibration mode, according to an alternate embodiment of the envelope power supply control signal and the envelope power supply signal, respectively.
Figure 6B:
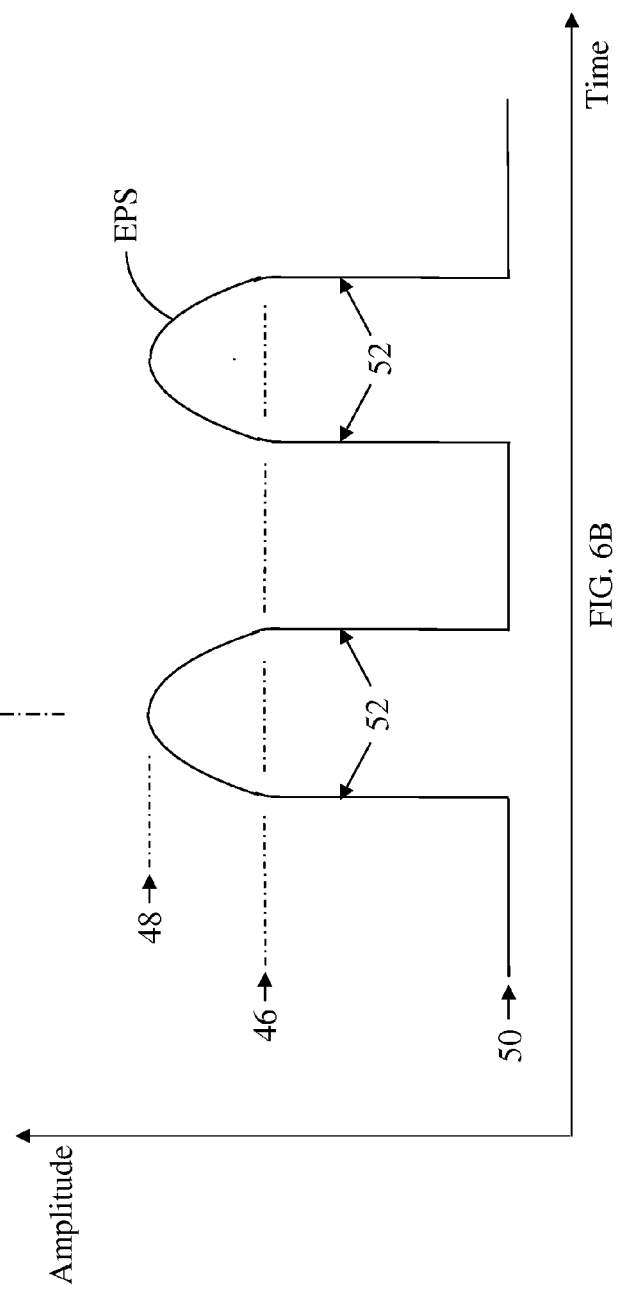

FIGS. 6A and 6B are graphs illustrating the envelope power supply control signal VRMP and the envelope power supply signal EPS shown in FIG. 1 during the calibration mode, according to an alternate embodiment of the envelope power supply control signal VRMP and the envelope power supply signal EPS, respectively. FIGS. 6A and 6B are described based on the RF communications system 10 illustrated in FIG. 1.

The envelope power supply control signal VRMP and the envelope power supply signal EPS illustrated in FIGS. 6A and 6B, respectively, are similar to the envelope power supply control signal VRMP and the envelope power supply signal EPS illustrated in FIGS. 5A and 5B, respectively, except a shape of the envelope power supply signal EPS illustrated in FIG. 6B is modified significantly.

In one embodiment of the supply control circuitry 28, during the calibration mode, when the setpoint of the envelope power supply signal EPS, which is based on the envelope power supply control signal VRMP as illustrated in FIG. 6A, transitions from below a setpoint threshold 46 to above the setpoint threshold 46, the supply control circuitry 28 causes a sharp transition 52 of the envelope power supply signal EPS from a target magnitude 50 of the setpoint of the envelope power supply signal EPS to the setpoint of the envelope power supply signal EPS, as illustrated in FIG. 6B. As such, the target magnitude 50 is less than the setpoint threshold 46.

In one embodiment of the supply control circuitry 28, during the calibration mode, the supply control circuitry 28 controls the envelope tracking power supply 30, such that when the setpoint of the envelope power supply signal EPS transitions from above the setpoint threshold 46 to below the setpoint threshold 46, the supply control circuitry 28 causes a sharp transition 52 of the envelope power supply signal EPS to the target magnitude 50.

In general, in one embodiment of the supply control circuitry 28, during the calibration mode, the supply control circuitry 28 controls the envelope tracking power supply 30, such that when the setpoint of the envelope power supply signal EPS transitions through the setpoint threshold 46, the supply control circuitry 28 causes the sharp transition 52 of the envelope power supply signal EPS. In one embodiment of the envelope power supply signal EPS, a maximum rate of change of the envelope power supply signal EPS during the sharp transition 52 is greater than a maximum rate of change of the envelope power supply signal EPS during the normal operation mode.

In a first embodiment of the setpoint threshold 46, the setpoint threshold 46 is greater than about fifty percent of an amplitude of the envelope power supply signal EPS. In a second embodiment of the setpoint threshold 46, the setpoint threshold 46 is greater than about sixty percent of the amplitude of the envelope power supply signal EPS. In a third embodiment of the setpoint threshold 46, the setpoint threshold 46 is greater than about seventy percent of the amplitude of the envelope power supply signal EPS. In a fourth embodiment of the setpoint threshold 46, the setpoint threshold 46 is greater than about eighty percent of the amplitude of the envelope power supply signal EPS. In one embodiment of the setpoint threshold 46, selection of the setpoint threshold 46 is based on providing sufficient sensitivity of a delay mismatch between the envelope power supply signal EPS and the RF input signal RFI.

In a first embodiment of the target magnitude 50, the target magnitude 50 is less than about 500 millivolts. In a second embodiment of the target magnitude 50, the target magnitude 50 is less than about 400 millivolts. In a third embodiment of the target magnitude 50, the target magnitude 50 is less than about 300 millivolts. In a fourth embodiment of the target magnitude 50, the target magnitude 50 is less than about 200 millivolts. In a fifth embodiment of the target magnitude 50, the target magnitude 50 is less than about 100 millivolts. In one embodiment of the target magnitude 50, selection of the target magnitude 50 is based on providing sufficient sensitivity of a delay mismatch between the envelope power supply signal EPS and the RF input signal RFI.

Figure 7:
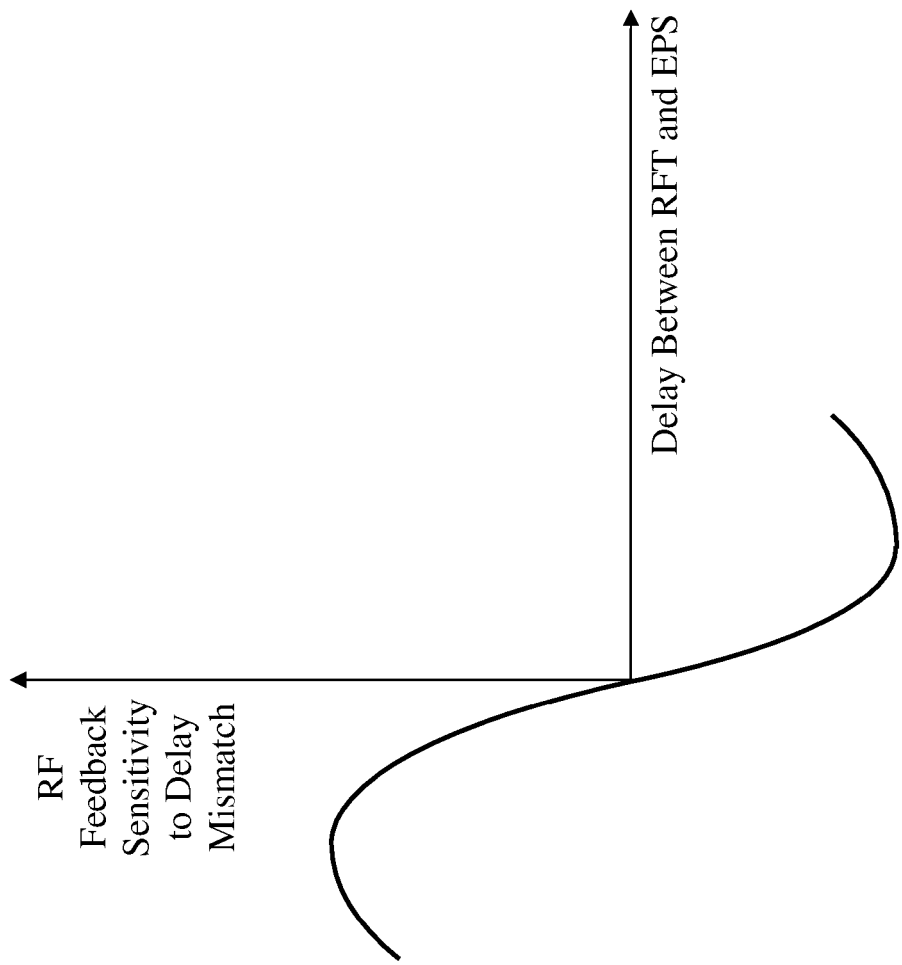
FIG. 7 is a graph illustrating sensitivity of an RF feedback circuit to delay mismatch between the RF transmit signal and the envelope power supply signal according to one embodiment of the RF feedback circuit.

FIG. 7 is a graph illustrating feedback sensitivity of the RF feedback circuit 26 to delay mismatch between the RF transmit signal RFT and the envelope power supply signal EPS according to one embodiment of the RF feedback circuit 26. FIG. 7 is described based on the RF communications system 10 illustrated in FIG. 1. As the delay mismatch between the RF transmit signal RFT and the envelope power supply signal EPS increases in a positive direction, the feedback sensitivity of the RF feedback circuit 26 increases in a negative direction until the feedback sensitivity reaches a maximum negative sensitivity peak. Similarly, as the delay mismatch between the RF transmit signal RFT and the envelope power supply signal EPS increases in a negative direction, the feedback sensitivity of the RF feedback circuit 26 increases in a positive direction until the feedback sensitivity reaches a maximum positive sensitivity peak. As a result, in one embodiment of the RF communications system 10, during the calibration mode, timing between the RF transmit signal RFT and the envelope power supply signal EPS are deliberately mismatched to increase delay mismatch sensitivity between the RF transmit signal RFT and the envelope power supply signal EPS, thereby improving characterization of the delay mismatch between the envelope power supply signal EPS and the RF input signal RFI, which may provide improved alignment of the envelope of the RF transmit signal RFT with the envelope power supply signal EPS during the normal operation mode.

FIGS. 8A and 8B are graphs illustrating the envelope power supply control signal VRMP and the envelope power supply signal EPS shown in FIG. 1 during the calibration mode, according to an additional embodiment of the envelope power supply control signal VRMP and the envelope power supply signal EPS, respectively. FIGS. 8A and 8B are described based on the RF communications system 10 illustrated in FIG. 1. The envelope power supply control signal VRMP and the envelope power supply signal EPS illustrated in FIGS. 8A and 8B are similar to the envelope power supply control signal VRMP and the envelope power supply signal EPS illustrated in FIGS. 6A and 6B, respectively, except during the calibration mode, the envelope power supply signal EPS illustrated in FIG. 8B is delayed from the envelope power supply control signal VRMP illustrated in FIG. 8A by a positive delay 54. In one embodiment of the envelope power supply control signal VRMP and the RF input signal RFI, during the calibration mode, the envelope power supply control signal VRMP and the RF input signal RFI are about phase-aligned with one another. Therefore, during the calibration mode, the envelope power supply signal EPS is delayed from the RF input signal RFI by the positive delay 54. In one embodiment of the positive delay 54, the positive delay 54 is based on the maximum positive sensitivity peak illustrated in FIG. 7. In one embodiment of the positive delay 54, the positive delay 54 is based on the transmitter configuration signal PACS.

FIGS. 9A and 9B are graphs illustrating the envelope power supply control signal VRMP and the envelope power supply signal EPS shown in FIG. 1 during the calibration mode, according to another embodiment of the envelope power supply control signal VRMP and the envelope power supply signal EPS, respectively. FIGS. 9A and 9B are described based on the RF communications system 10 illustrated in FIG. 1. The envelope power supply control signal VRMP and the envelope power supply signal EPS illustrated in FIGS. 9A and 9B are similar to the envelope power supply control signal VRMP and the envelope power supply signal EPS illustrated in FIGS. 6A and 6B, respectively, except during the calibration mode, the envelope power supply signal EPS illustrated in FIG. 9B is delayed from the envelope power supply control signal VRMP illustrated in FIG. 9A by a negative delay 56. In one embodiment of the envelope power supply control signal VRMP and the RF input signal RFI, during the calibration mode, the envelope power supply control signal VRMP and the RF input signal RFI are about phase-aligned with one another. Therefore, during the calibration mode, the envelope power supply signal EPS is delayed from the RF input signal RFI by the negative delay 56. In one embodiment of the negative delay 56, the negative delay 56 is based on the maximum negative sensitivity peak illustrated in FIG. 7. In one embodiment of the negative delay 56, the negative delay 56 is based on the transmitter configuration signal PACS.

In one embodiment of the RF communications system 10 illustrated in FIGS. 1 and 2, any combination of the positive delay 54 (FIGS. 8A and 8B), the negative delay 56 (FIGS. 9A and 9B), and the sharp transition 52 (FIG. 6B) may be used to provide sufficient sensitivity of a delay mismatch between the envelope power supply signal EPS and the RF input signal RFI. In a first exemplary embodiment of the RF communications system 10, by using either the positive delay 54 (FIGS. 8A and 8B) or the negative delay 56 (FIGS. 9A and 9B), the feedback sensitivity of the RF feedback circuit 26 is on the order of about 0.2 decibels/nanosecond, which may allow the RF communications system 10 to align the envelope power supply signal EPS and the RF input signal RFI during the normal operation mode within about 0.5 nanoseconds.

In a second exemplary embodiment of the RF communications system 10, by using both the positive delay 54 (FIGS. 8A and 8B) and the negative delay 56 (FIGS. 9A and 9B), the effective feedback sensitivity of the RF feedback circuit 26 is on the order of about 0.4 decibels/nanosecond, which may allow the RF communications system 10 to align the envelope power supply signal EPS and the RF input signal RFI during the normal operation mode within about 0.25 nanoseconds.

In a third exemplary embodiment of the RF communications system 10, by using a combination of the positive delay 54 (FIGS. 8A and 8B), the negative delay 56 (FIGS. 9A and 9B), and the sharp transition 52 (FIG. 6B), the effective feedback sensitivity of the RF feedback circuit 26 is on the order of about 1.0 decibels/nanosecond, which may allow the RF communications system 10 to align the envelope power supply signal EPS and the RF input signal RFI during the normal operation mode within about 0.1 nanoseconds.

FIGS. 10A and 10B are graphs illustrating transition times of the envelope power supply signal EPS during the sharp transition 52 from the target magnitude 50 to the setpoint threshold 46 and during the sharp transition 52 from the setpoint threshold 46 to the target magnitude 50, respectively, according to one embodiment of the envelope power supply signal EPS illustrated in FIGS. 6B, 8B, and 9B.

FIG. 10A illustrates a transition time 58 of the sharp transition 52 of the envelope power supply signal EPS from the target magnitude 50 to the setpoint threshold 46. The transition time 58 is defined as the time needed for the envelope power supply signal EPS to traverse from ten percent of the sharp transition 52 to ninety percent of the sharp transition 52. FIG. 10B illustrates the transition time 58 of the sharp transition 52 of the envelope power supply signal EPS from the setpoint threshold 46 to the target magnitude 50. The transition time 58 is defined as the time needed for the envelope power supply signal EPS to traverse from ninety percent of the sharp transition 52 to ten percent of the sharp transition 52.

In a first embodiment of the transition time 58, the transition time 58 is less than about one-seventh divided by a normal operation mode bandwidth of the envelope power supply signal EPS. In a second embodiment of the transition time 58, the transition time 58 is less than about one-tenth divided by the normal operation mode bandwidth of the envelope power supply signal EPS. In a third embodiment of the transition time 58, the transition time 58 is less than about one-twentieth divided by the normal operation mode bandwidth of the envelope power supply signal EPS. In a fourth embodiment of the transition time 58, the transition time 58 is less than about one-fiftieth divided by the normal operation mode bandwidth of the envelope power supply signal EPS. In a fifth embodiment of the transition time 58, the transition time 58 is less than about one-hundredth divided by the normal operation mode bandwidth of the envelope power supply signal EPS. In a sixth embodiment of the transition time 58, the transition time 58 is less than about two-hundredth divided by the normal operation mode bandwidth of the envelope power supply signal EPS.

Figure 11:
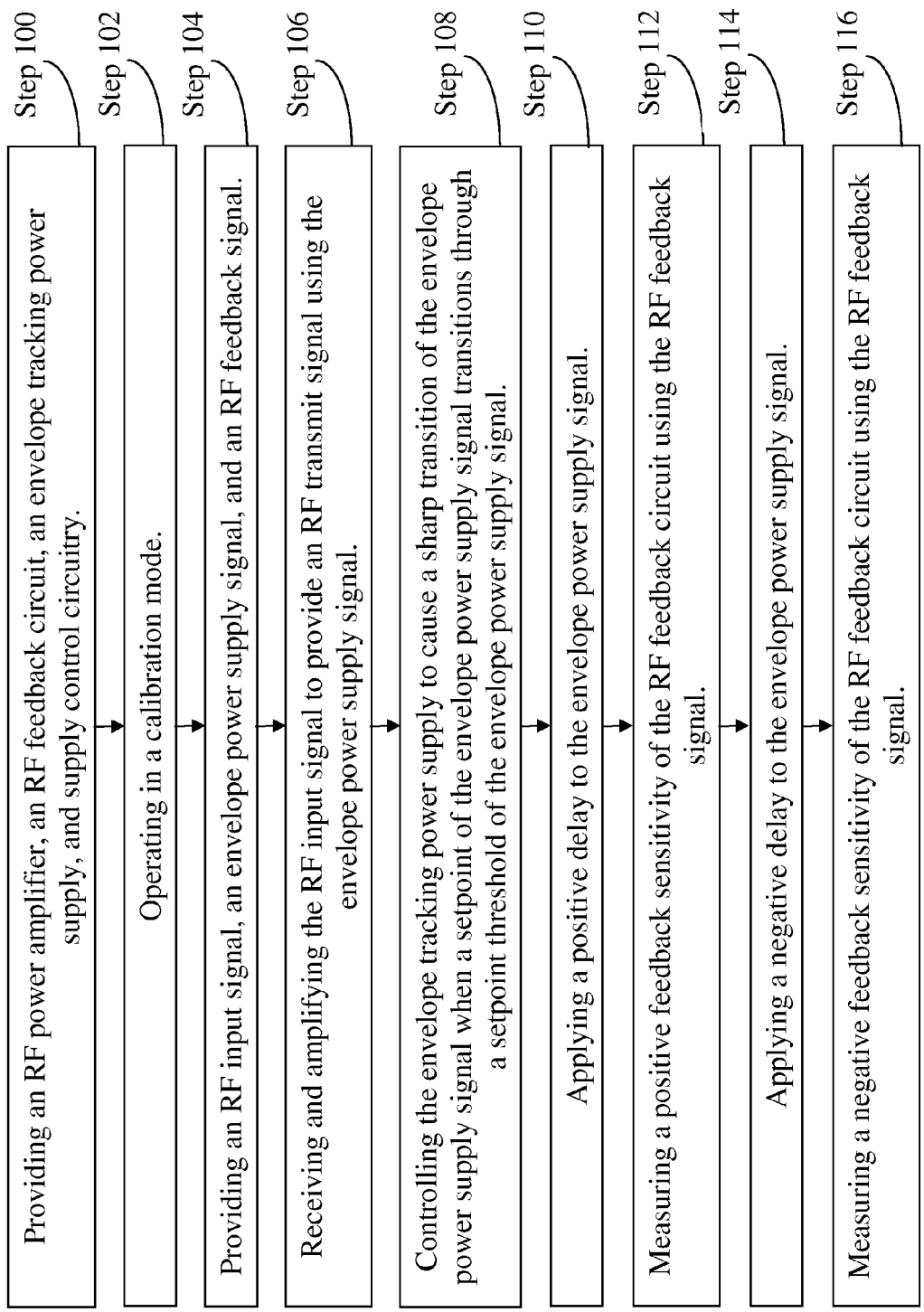
FIG. 11 illustrates a process for calibrating the RF communications system illustrated in FIGS. 1 and 2 according to one embodiment of the RF communications system.

FIG. 11 illustrates a process for calibrating the RF communications system 10 illustrated in FIGS. 1 and 2 according to one embodiment of the RF communications system 10. The calibration process begins by providing an RF power amplifier 24, an RF feedback circuit 26, an envelope tracking power supply 30, and an supply control circuitry 28 (Step 100). The calibration process proceeds by operating in the calibration mode (Step 102). The calibration process is furthered by providing an RF input signal RFI, an envelope power supply signal EPS, and an RF feedback signal RFF (Step 104).

The calibration process continues by receiving and amplifying the RF input signal RFI to provide an RF transmit signal RFT using the envelope power supply signal EPS (Step 106). The process advances by controlling the envelope tracking power supply 30 to cause a sharp transition 52 (FIG. 6B) of the envelope power supply signal EPS when a setpoint of the envelope power supply signal EPS transitions through a setpoint threshold 46 of the envelope power supply signal EPS (Step 108).

The calibration process proceeds by applying a positive delay 54 (FIGS. 8A and 8B) to the envelope power supply signal EPS (Step 110). The calibration process is furthered by measuring a positive feedback sensitivity of the RF feedback circuit 26 using the RF feedback signal RFF (Step 112).

The calibration process proceeds by applying a negative delay 56 (FIGS. 9A and 9B) to the envelope power supply signal EPS (Step 114). The calibration process is furthered by measuring a negative feedback sensitivity of the RF feedback circuit 26 using the RF feedback signal RFF (Step 116).

In one embodiment of the RF communications system 10, the delay calibration data 32 is based on both the positive feedback sensitivity and the negative feedback sensitivity. In an alternate embodiment of the RF communications system 10, Steps 114 and 116 are omitted, such that the delay calibration data 32 is based on the positive feedback sensitivity. In an additional embodiment of the RF communications system 10, Steps 110 and 112 are omitted, such that the delay calibration data 32 is based on the negative feedback sensitivity.

Those skilled in the art will recognize improvements and modifications to the embodiments of the present disclosure. All such improvements and modifications are considered within the scope of the concepts disclosed herein and the claims that follow.

What is claimed is:

1. An apparatus comprising an RF power amplifier, an envelope tracking power supply, and supply control circuitry; and configured to operate in one of a normal operation mode and a calibration mode, such that during the calibration mode:
   the RF power amplifier is configured to receive and amplify an RF input signal to provide an RF transmit signal using an envelope power supply signal; and
   the supply control circuitry is configured to control the envelope tracking power supply to cause a sharp transition of the envelope power supply signal when a setpoint of the envelope power supply signal transitions through a setpoint threshold of the envelope power supply signal, wherein a maximum rate of change of the envelope power supply signal during the sharp transition is greater than a maximum rate of change of the envelope power supply signal during the normal operation mode.

2. The apparatus of claim 1 wherein a transition time of the sharp transition is less than about one-twentieth divided by a normal operation mode bandwidth of the envelope power supply signal.

3. The apparatus of claim 1 wherein a transition time of the sharp transition is less than about one-tenth divided by a normal operation mode bandwidth of the envelope power supply signal.

4. The apparatus of claim 1 wherein during the calibration mode, the sharp transition is from the setpoint to a target magnitude of the envelope power supply signal when the setpoint transitions from above the setpoint threshold to below the setpoint threshold.

5. The apparatus of claim 4 wherein during the calibration mode, the sharp transition is from the target magnitude to the setpoint when the setpoint transitions from below the setpoint threshold to above the setpoint threshold.

6. The apparatus of claim 4 wherein the target magnitude is less than about 500 millivolts.

7. The apparatus of claim 1 wherein during the calibration mode, the sharp transition is from a target magnitude of the envelope power supply signal to the setpoint when the setpoint transitions from below the setpoint threshold to above the setpoint threshold.

8. The apparatus of claim 7 wherein the target magnitude is less than about 500 millivolts.

9. The apparatus of claim 1 wherein the setpoint threshold of the envelope power supply signal is greater than about sixty percent of an amplitude of the envelope power supply signal.

10. The apparatus of claim 1 wherein during the calibration mode, the envelope power supply signal is delayed from the RF input signal by a positive delay.

11. The apparatus of claim 10 wherein the positive delay is based on a maximum positive sensitivity peak.

12. The apparatus of claim 1 wherein during the calibration mode, the envelope power supply signal is delayed from the RF input signal by a negative delay.

13. The apparatus of claim 12 wherein the negative delay is based on a maximum negative sensitivity peak.

14. The apparatus of claim 1 further comprising an RF feedback circuit configured to provide an RF feedback signal based on the RF transmit signal, wherein during the calibration mode, the RF feedback signal is representative of a delay mismatch between the envelope power supply signal and the RF input signal.

15. The apparatus of claim 14 wherein delay calibration data is based on the RF feedback signal.

16. The apparatus of claim 1 wherein during the normal operation mode, the RF power amplifier is configured to receive and amplify the RF input signal to provide the RF transmit signal using the envelope power supply signal.

17. The apparatus of claim 1 wherein during the normal operation mode, RF system control circuitry uses delay calibration data to approximately align an envelope of the RF transmit signal with the envelope power supply signal.

18. The apparatus of claim 1 wherein the envelope power supply signal is based on an envelope power supply control signal.

19. The apparatus of claim 18 wherein system control circuitry is configured to provide the envelope power supply control signal.

20. The apparatus of claim 1 wherein during the calibration mode, the envelope power supply signal has a calibration envelope peak, such that during the calibration mode, the envelope power supply signal has a maximum value of the calibration envelope peak.

21. The apparatus of claim 20 wherein during the normal operation mode, the envelope power supply signal has a normal envelope peak, such that during the calibration mode, the maximum value of the calibration envelope peak is about equal to a maximum value of the normal envelope peak.

22. The apparatus of claim 20 wherein the maximum value of the calibration envelope peak is equal to about 4.5 volts.

23. A method comprising:
   providing an RF power amplifier, an envelope tracking power supply, and supply control circuitry;
   operating in one of a normal operation mode and a calibration mode;
   receiving and amplifying an RF input signal to provide an RF transmit signal using an envelope power supply signal; and
   during the calibration mode, controlling the envelope tracking power supply to cause a sharp transition of the envelope power supply signal when a setpoint of the envelope power supply signal transitions through a setpoint threshold of the envelope power supply signal, wherein a maximum rate of change of the envelope power supply signal during the sharp transition is greater than a maximum rate of change of the envelope power supply signal during the normal operation mode.

* * * * *